(12) United States Patent
Nicolaidis

(10) Patent No.: US 7,778,001 B2
(45) Date of Patent: Aug. 17, 2010

(54) INTEGRATED CIRCUIT PROTECTED AGAINST SHORT CIRCUITS AND OPERATING ERRORS FOLLOWING THE PASSAGE ON AN IONIZING RADIATION

(75) Inventor: Michaël Nicolaidis, Saint Egreve (FR)

(73) Assignee: IROC Technologies, Grenoble (FR)

( * ) Notice: Subject to any disclaimer, the term of this patent is extended or adjusted under 35 U.S.C. 154(b) by 87 days.

(21) Appl. No.: 11/922,189

(22) PCT Filed: Jun. 16, 2006

(86) PCT No.: PCT/FR2006/050567

§ 371 (c)(1),
(2), (4) Date: Nov. 7, 2008

(87) PCT Pub. No.: WO2006/134308

PCT Pub. Date: Dec. 21, 2006

(65) Prior Publication Data
US 2009/0128975 A1 May 21, 2009

(30) Foreign Application Priority Data
Jun. 17, 2005 (FR) .................................. 05 51663

(51) Int. Cl.
*H02H 9/08* (2006.01)
*G11C 29/00* (2006.01)

(52) U.S. Cl. ...................... 361/93.9; 361/91.1; 714/721
(58) Field of Classification Search ................. 361/93.9
See application file for complete search history.

(56) References Cited

U.S. PATENT DOCUMENTS

| 5,469,065 | A | 11/1995 | Houston |
| 6,038,183 | A * | 3/2000 | Tsukude ...................... 365/201 |
| 2002/0080676 | A1 | 6/2002 | Scott |
| 2004/0165417 | A1 | 8/2004 | Lesea |

OTHER PUBLICATIONS

International Search Report dated Dec. 28, 2006.

* cited by examiner

*Primary Examiner*—Stephen W Jackson
*Assistant Examiner*—Dharti H Patel
(74) *Attorney, Agent, or Firm*—Howard IP Law Group, PC

(57) ABSTRACT

An integrated circuit chip comprising a number of semiconductor components exhibiting parasitic components through which a short-circuit between the circuit supply voltage and ground could occur, wherein said semiconductor components are distributed in elementary blocks, each elementary block being independently connected, for its power supply, to the supply or ground lines of the main supply network of the integrated circuit by a current-limiting device capable of stopping a short-circuit starting in the considered block, and each block being sized so that logic errors occurring in this block are correctable by error-correction means.

15 Claims, 5 Drawing Sheets

INTEGRATED CIRCUIT PROTECTED AGAINST SHORT CIRCUITS AND OPERATING ERRORS FOLLOWING THE PASSAGE ON AN IONIZING RADIATION

This application claims the benefit of Int'l. Application No. PCT/FR2006/050567, filed Jun. 16, 2006 and French Application No. 05/51663, filed Jun. 17, 2005, the entire disclosures of which are incorporated herein by reference.

BACKGROUND OF THE INVENTION

1. Field of the Invention

The present invention relates to integrated circuits, the operation of which may be disturbed by an ionizing radiation.

2. Discussion of the Related Art

FIG. 1 is a cross-section view of an N-channel MOS transistor (NMOS) and of a P-channel MOS transistor (PMOS) of a portion of a SRAM-type memory comprised within an integrated circuit. The integrated circuit is formed in and above a lightly-doped P-type substrate 1. An N-type well 2 is formed in the upper portion of substrate 1. In the present description, "well" will be used to designate a relatively thick upper substrate area or portion at the surface of which MOS transistor drain/source areas may be formed. In this example, two drain/source areas 3 and 4 are placed at the surface of N well 2. A heavily-doped N-type well contact area 5 is placed at the surface of N well 2. Drain/source areas 6 and 7 are placed at the surface of substrate 1. A heavily-doped P-type substrate contact area 8 is placed at the surface of substrate 1. Drain/source areas 3/4 and 6/7 are separated by channel areas above which are placed insulated gates 10 and 11.

This memory portion exhibits a set of parasitic components which are not disturbing in a standard use of the memory but which may become so when a radiation reaches the substrate at the level of this cell. A set of charged particles is then created along the path of the radiation in substrate 1, and/or well 2. Such a set of charges then generates parasitic currents likely to trigger a latch-up phenomenon, which is described hereafter.

Source area 4, N well 2, and substrate 1 form a first parasitic PNP bipolar transistor T1. Source area 7, substrate 1, and N well 2 form a second parasitic NPN bipolar transistor T2. Further, N well 2 is equivalent to a resistor R1 between well contact area 5 and the base of parasitic transistor T1. Similarly, P substrate 1 is equivalent to a resistor R2 between substrate contact area 8 and the base of parasitic transistor T2.

FIG. 2 is an equivalent electric diagram of the parasitic circuit formed by the above-mentioned parasitic components. In a standard memory use, source area 4 and well contact area 5 are connected to a supply voltage Vdd. Source area 7 of the NMOS transistor and substrate contact area 8 are connected to ground GND. The emitter of transistor T1, corresponding to source area 4, and resistor R1 are then connected to supply voltage Vdd. The emitter of transistor T2, corresponding to source area 7, and resistor R2 are grounded. Resistor R1 is placed between the emitter and the base of transistor T1. Resistor R2 is placed between the ground and the base of transistor T2. The collector of transistor T1 is connected to the base of transistor T2. Similarly, the collector of transistor T2 is connected to the base of transistor T1.

When a radiation reaches the substrate, a parasitic current ip creates through resistor R2 and, accordingly, a voltage V2 creates across resistor R2. Voltage V2 is applied between the base and the emitter of transistor T2. Voltage V2 can be sufficient to turn on transistor T2. A current i2 then crosses transistor T2 and resistor R1 and a voltage V1 creates across resistor R1. Voltage V1 is applied between the base and the emitter of transistor T1. When voltage V1 is sufficient, bipolar transistor T1 turns on. A current i1 then crosses transistor T1 and resistor R2. The system is then "latched up" since each transistor generates the current necessary to turn on the other transistor. The occurrence of this parasitic thyristor latch-up or turn-on phenomenon results in creating a very lightly resistive conduction path between supply voltage Vdd and ground GND.

Known means for avoiding the above-described latch-up phenomenon comprise modifying the structure of the memory cell such as shown in FIG. 1. However, such solutions result in increasing the circuit size, which goes against an ever-increasing integration of the number of components on a given integrated circuit surface area.

Further, technological solutions enable decreasing the probability of occurrence of the latch-up phenomenon but do not totally suppress the risk of having a short-circuit between the supply voltage and the ground, such a short-circuit causing not only a significant consumption but also operation errors of the integrated circuit.

SUMMARY OF THE INVENTION

An object of the present invention is to provide an integrated circuit which enables avoiding one or several of the above-mentioned disadvantages.

Another object of the present invention is to provide an integrated circuit which exhibits no operation error after the passing of an ionizing radiation.

To achieve these objects, the present invention provides an integrated circuit chip comprising a large number of semiconductor components exhibiting parasitic components through which a short-circuit between the circuit supply voltage and ground could occur, said semiconductor components being distributed in elementary blocks, each elementary block being independently connected to the supply or ground lines of the main supply network of the integrated circuit by a current-limiting device capable of stopping a short-circuit starting in the considered block, and each block being sized so that logic errors occurring in this block are correctable by error-correction means.

According to an alternative embodiment of the above-mentioned chip, the chip further comprises for at least one elementary block a current detector capable of detecting an abnormally high current in the considered block, the use of current detectors enabling locating the elementary blocks likely to exhibit errors, this locating enabling simplifying and/or making more effective said error-correction means.

In an alternative embodiment of the above-described chip, at least one current-limiting device associated with an elementary block is a switch placed between the ground or supply lines of this elementary block and those of the integrated circuit supply network, this switch being controlled by the current detector connected to the considered elementary block to turn off the switch when the current flowing through the ground or supply lines of the considered block is greater than a predefined threshold value.

In an alternative embodiment of the above-described chip, the current-limiting devices are transistors.

In an alternative embodiment of the above-described chip, each time a given current detector detects an abnormally high current, said error-correction means correct the possible errors introduced into the elementary block connected to the given current detector.

In an alternative embodiment of the above-described chip, the chip comprises at least one memory storing a set of words of several bits, each bit corresponding to a memory cell, the memory cells being distributed in different elementary blocks, and the ground or supply line(s) of each elementary block of cells being connected to the ground or supply lines of the main supply network of the integrated circuit via a current-limiting device.

In an alternative embodiment of the above-described chip, the distribution of the memory cells in different elementary blocks is such that each elementary block comprises at most a single bit of a given word.

In an alternative embodiment of the above-described chip, each memory comprises a control block in which are stored error-correction codes, each error-correction code being associated with a word in the memory, and said error-correction means use the values stored by the error-correction codes to correct the possible errors present in a memory.

In an alternative embodiment of the above-described chip, each memory comprises a control block in which are stored error-detection codes, such as parity bits, each error-correction code being associated with a word in the memory, and said error-correction means use the values stored by the error-detection codes to correct the possible errors present in a memory.

In an alternative embodiment of the above-described chip, the chip further comprises at least one address storage device referencing the elementary blocks of a memory in which an abnormally high current has been detected by current detectors associated with these blocks, the error-correction means using the data referenced by said at least one address storage device to correct the possible errors present in a memory.

In an alternative embodiment of the above-described chip, the error-correction means regularly verify whether said at least one address storage device references an elementary block, and if such is the case, the error-correction means perform readings of the words of the memory comprising cells placed in the referenced elementary block, then verify whether the read words are correct by means of error-control codes associated with each of these words, and perform, if necessary, writings into the considered memory to correct the words exhibiting errors.

In an alternative embodiment of the above-described chip, current detectors associated with the elementary cell blocks are provided to detect two types of abnormally high currents in the ground or supply lines of these elementary blocks, the first type of abnormally high current being a current of high intensity corresponding to a short-circuit between the supply voltage and the circuit ground, the second type of abnormally high current being a transient current peak reflecting a change in the value stored in one or more of the memory cells, a detection of a first or of a second type of current being indicated to the error-correction means so that the latter perform, if necessary, error corrections in the concerned memory.

In an alternative embodiment of the above-described chip, the chip comprises a synchronous logic processing device, such as a microprocessor, which comprises a set of registers in series between an input and an output of the device, the output of each register being connected to an input of a multiplexer and to an input of a storage element having its output connected to the other input of the multiplexer, the output of each multiplexer being connected to the input of a register or to the output of the device via, possibly, a combinational block, the registers, the multiplexers, and the combinational blocks forming a first elementary block and the storage elements forming a second elementary block, the registers recording the data present on their inputs at the rate of a clock signal, each storage element keeping the last k values recorded by the register to which it is connected, the storage elements forming error-correction means capable of setting back the registers to a correct logic state after a detection of an abnormally high current in the first elementary block.

The present invention further provides an electronic system comprising an integrated circuit chip such as described previously, said error-correction means being placed outside of the chip and being connected to the chip by a set of electric connections.

The foregoing and other objects, features, and advantages of the present invention will be discussed in detail in the following non-limiting description of specific embodiments in connection with the accompanying drawings.

DETAILED DESCRIPTION

Figure 1:
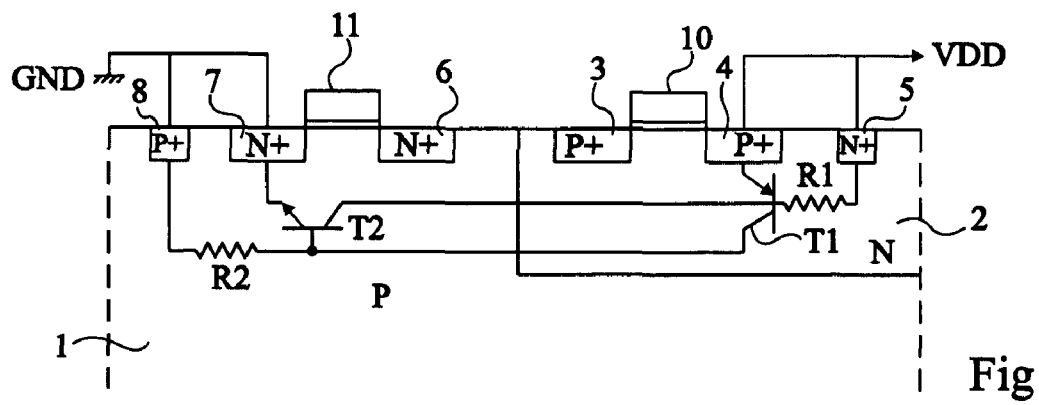
FIG. 1 is a previously described cross-section view of a portion of a SRAM cell.
Figure 2:
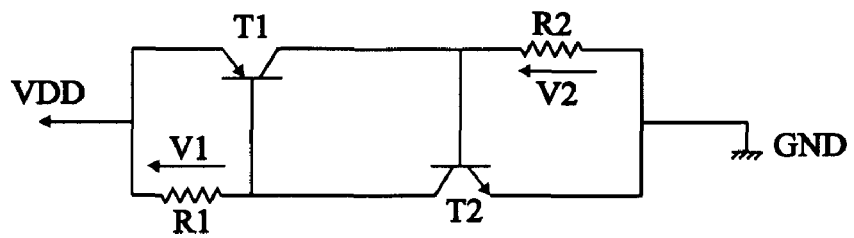
FIG. 2 is an equivalent diagram of the parasitic elements of the cell shown in FIG. 1.

For clarity, the same elements have been designated with the same reference numerals in the different drawings and, further, as usual in the representation of integrated circuits, FIG. 1 is not drawn to scale.

Generally, an integrated circuit comprises a set of functional blocks such as a memory or a microprocessor, as well as a supply network formed of a set of lines connected to ground GND, which will be called ground lines hereafter, and of a set of lines connected to a supply voltage Vdd, which will be called supply lines hereafter. The ground and/or supply lines belong to the interconnect network of the integrated circuit placed above the substrate in which the semiconductor components of the circuit are formed. The interconnect network is generally formed of several conductive track levels between which are placed conductive via levels. The "main" supply network of an integrated circuit may be formed of a set of ground and supply lines, often called "rails", and placed on the last track levels of the integrated circuit. The supply levels "specific" to each of the functional blocks are generally formed of a set of ground and supply lines placed above the semiconductor components of each block at lower levels than those of the main supply network rails and are connected thereto by a set of conductive vias.

An integrated circuit according to the present invention comprises a set of "critical" semiconductor components exhibiting parasitic components such as bipolar transistors T1 and T2 of the memory shown in FIG. 1. The parasitic components are connected to one another and form parasitic circuits connected to the integrated circuit supply voltage and ground. A latch-up phenomenon, such as described previously, may occur through each of these parasitic circuits at the passing of an ionizing radiation through the integrated circuit substrate.

According to an aspect of the present invention, the "critical" semiconductor components, that is, those comprising parasitic components through which a short-circuit between the supply voltage and the ground could occur, are distributed in several elementary blocks. Each elementary block is connected to the main supply network by a current-limiting device capable of stopping a short-circuit between the supply voltage and the ground starting in the considered block. The cutting-up of the integrated circuit into elementary blocks and a distinct power supply for each of these elementary blocks enable easing the error-correction operations in the elementary blocks as will appear from the examples given hereafter.

Figure 3:
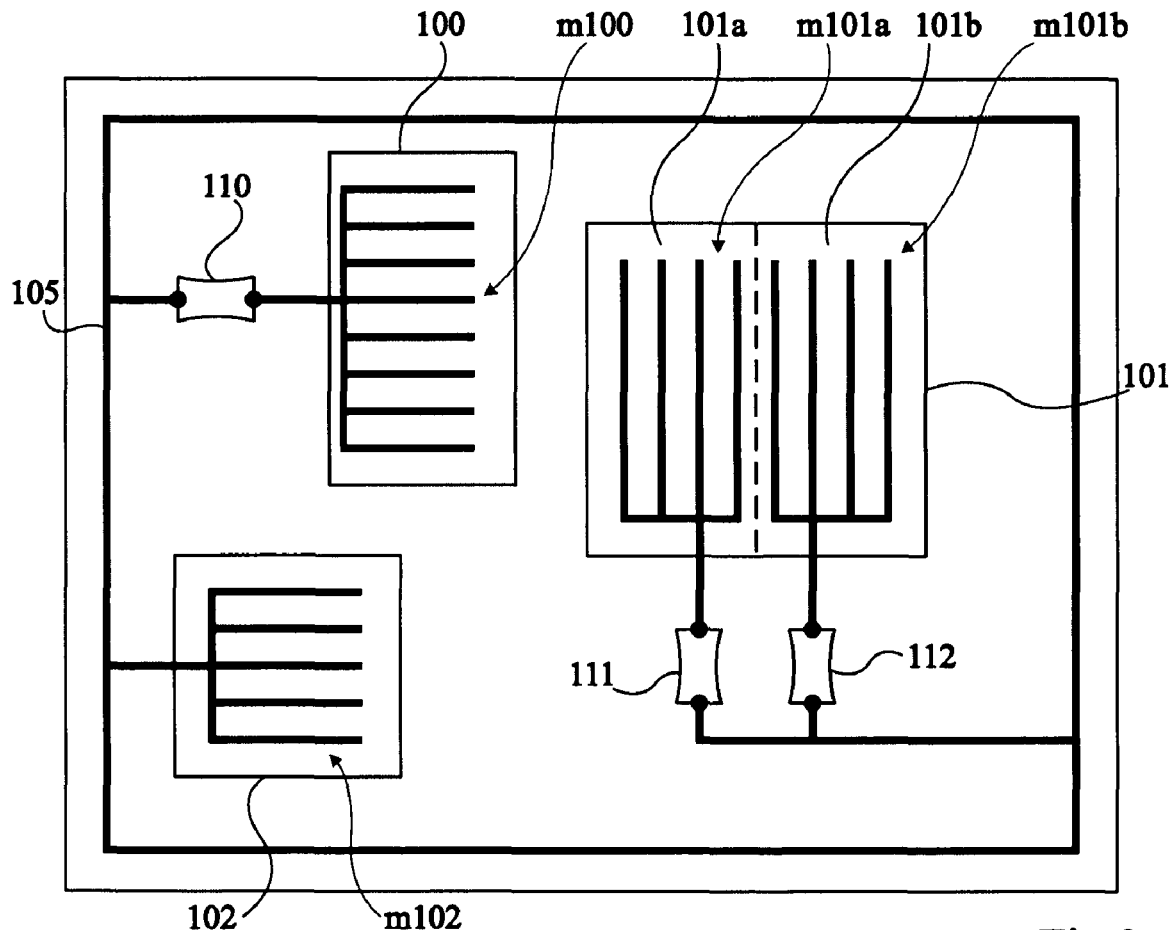
FIG. 3 is a simplified representation of a circuit according to the present invention.

FIG. 3 is a simplified representation of an example of an integrated circuit according to the present invention. The integrated circuit comprises three functional blocks 100, 101, and 102 which respectively are a microprocessor, a memory, and a phase-locked loop circuit. The main supply network of the circuit comprises a ring-shaped rail 105 placed at the periphery of the integrated circuit and for example connected to ground GND of the integrated circuit. For simplification, supply lines VDD of the main supply network are not shown.

Blocks 100 and 101 comprise "critical" semiconductor components which comprise parasitic components through which a latch-up phenomenon may occur. Block 102 comprises no critical semiconductor components or comprises only slightly critical components since there is a very low probability for a latch-up phenomenon to occur at the level of this block.

In this example, ground lines m100 of block 100 are connected to ring-shaped rail GND 105 via a current-limiting device 110. Two sub-blocks 101a and 101b of block 101 are separately supplied by two groups of ground lines m101a and m101b. The groups of ground lines m101a and m101b of sub-blocks 101a and 101b are respectively connected to rail 105 by current-limiting devices 111 and 112. Ground lines m102 of block 102 are directly connected to ring-shaped rail 105.

Each current-limiting device 110, 111, and 112 is provided on the one hand to conduct a standard current Is through the block to which it is connected, when this block operates normally and, on the other hand, to limit the current that can flow when a significant current "surge" appears at the level of a block after, for example, the occurrence of a latch-up phenomenon. This current limitation may be total or partial. A limitation is total when no further significant current flows through the current-limiting device. A limitation is partial when the current that can flow through the current-limiting device on occurrence of a short-circuit is lower than the minimum current necessary to maintain the short-circuit through the parasitic components of the "hit" block.

Examples of current-limiting devices are given hereafter.

Figure 4:
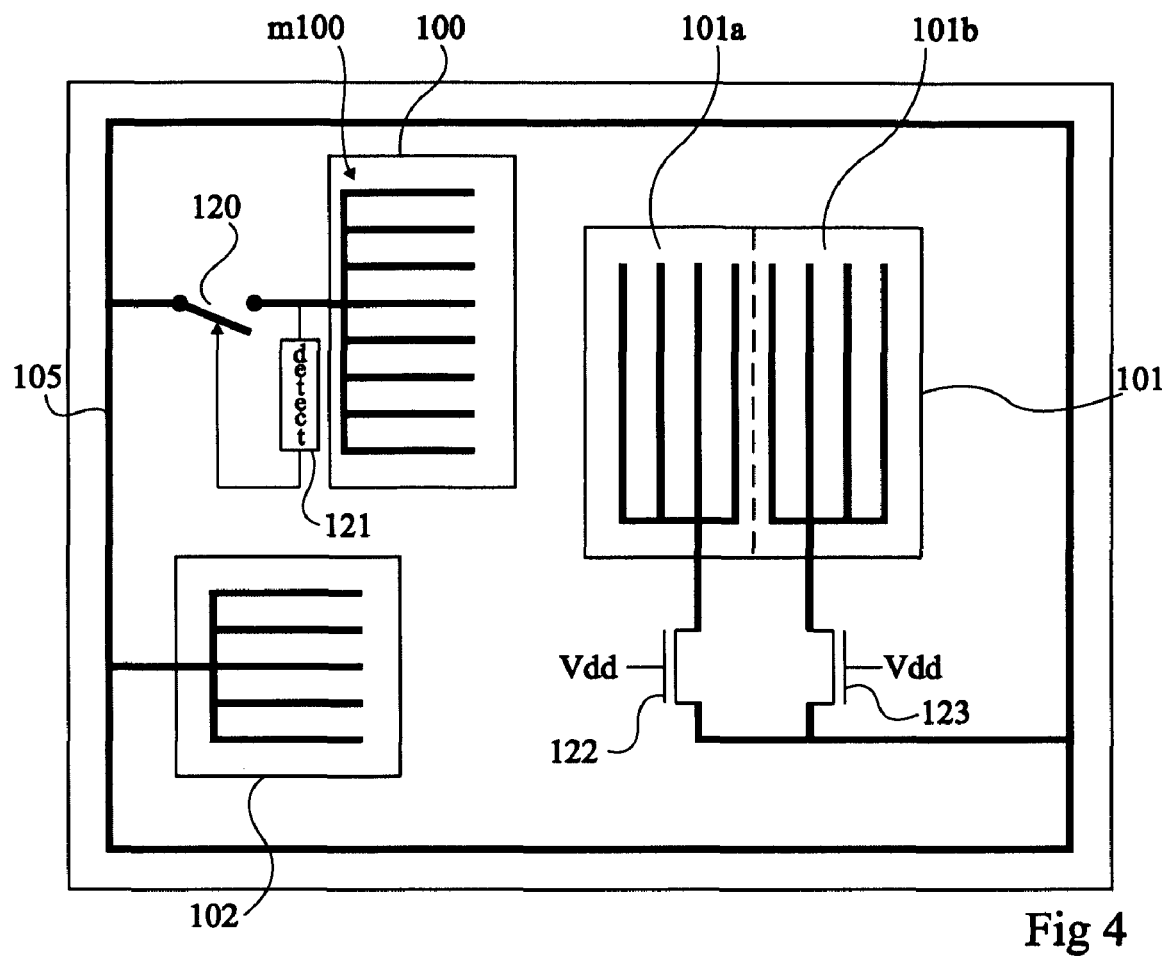
FIG. 4 is a simplified representation of an embodiment of a circuit according to the present invention.

FIG. 4 is a more detailed simplified representation of the integrated circuit shown in FIG. 3 in which examples of current-limiting devices are shown.

A current-limiting device 110 is in this example a switch 120. This switch may be a P- or N-channel MOS transistor. A current detector 121 is connected to ground lines m100 of block 100 to measure the current flowing through all these ground lines. Current detector 121 is connected to switch 120 to control the turning off of this switch when the current flowing through block 100 is too high.

More specifically, when an ionizing radiation reaches the integrated circuit substrate at the level of block 100 and a latch-up phenomenon starts in this block, the current flowing through switch 120 and ground lines m100 increases. When this current exceeds a predefined threshold current, detector 121 controls the turning-off of switch 120. The current crossing the ground lines decreases and generally becomes zero rather fast, the current-decrease time especially depending on the capacitive loads of the ground lines. When the current detected by current detector 121 decreases below the predefined threshold current, current detector 121 controls the turning-on of switch 120. The turning-on of switch 120 may also be controlled, by the current detector or another control circuit not shown, when a determined time has elapsed after the turning-off of switch 120. It should be noted that the value of the threshold current used to detect a short-circuit and control the turning off of the switch may be different from that used to control the switch turning-on.

Current-limiting devices 111 and 112 are in this example N-channel MOS transistors 122 and 123 having their gates permanently connected to supply voltage Vdd of the integrated circuit. Such devices are called "resistor transistors" hereafter.

The "resistor transistors" may be used by blocks or sub-blocks exhibiting relatively low dynamic currents, such as memories. In the case of a synchronous logic block such as a microprocessor, the current drawn by the block on each clock pulse is generally relatively high and the voltage drop across the current-limiting device must remain low. The use of a switch associated with a current detector is then preferable since a simple permanently conductive MOS transistor exhibits too high an intrinsic resistance for this type of use. Such a switch may be a MOS transistor exhibiting a low resistance between its source and its drain.

When an elementary block is "hit" by an ionizing radiation and a short-circuit forms at the level of this block between supply voltage Vdd and ground GND, the supply of this block may be cut-off, in the case of switch 120, or disturbed in the case of resistor transistors 122 and 123. Thereby, logic errors may occur at the level of the hit block. It should be noted that the presence of the current-limiting devices enables "confining" the errors in the hit block since only the power supply of this block has been disturbed, since the other blocks have not been touched. For the circuit to recover a correct operating state when a block has been hit, it is generally necessary for the error correction means to set the hit block back to a correct logic state. The used error-correction means are adapted to each of the elementary blocks of the integrated circuit.

To be able to set each elementary block back to a correct logic state, the cutting-up of the circuit into independently-powered elementary blocks must be performed judiciously. Each elementary block must indeed be associated with error-correction means capable of correcting any error affecting any portion of the elementary block. Further, the cutting-up of the integrated circuit into several elementary blocks enables using simple error-correction means, that is, fast means with a low bulk and a low complexity. It should further be noted that the error-correction means of one or several elementary blocks may be simplified or made more efficient in the case where each elementary block is connected to a current detector capable of detecting abnormally high currents in the considered block, where the locating of the blocks likely to exhibit errors eases the correction of such possible errors, as will appear in the following examples.

Figure 5:
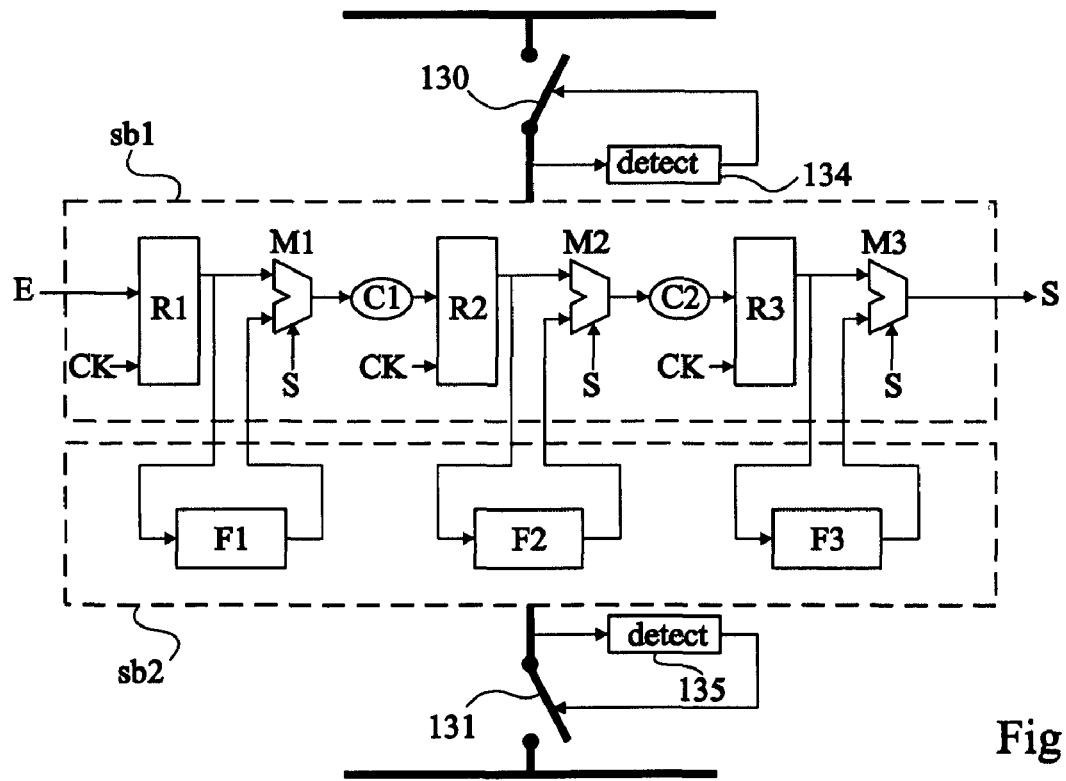
FIG. 5 is a diagram of a logic processing unit belonging to an integrated circuit according to the present invention.

FIG. 5 is a diagram of a portion of a processing and calculation device such as a microprocessor belonging to an integrated circuit according to the present invention. The device comprises a set of registers R1 to R3 placed in series between an input E and an output S. Registers R1 to R3 are synchronized by a clock signal CK. The outputs of registers R1, R2, and R3 are respectively connected to the inputs of storage circuits F1, F2, and F3 and to one of the inputs of multiplexers M1, M2, and M3 controlled by a selection signal S. The outputs of storage circuits F1, F2, and F3 are respectively connected to the other one of the inputs of multiplexers M1, M2, and M3. Combinational blocks C1 and C2 are respectively placed between the output of multiplexer M1 or M2 and the input of register R2 or R3.

An embodiment of storage circuits F1 to F3 is described in detail in French patent application 2828601 of the applicant. Storage circuits F1 to F4 are for example memories of "first-in first-out" type.

Registers R1, R2, and R3, multiplexers M1, M2, and M3 and combinational blocks C1 and C2 form a first sub-block sb1 of the processing and calculation device. Storage circuits F1, F2, and F3 form a second sub-block sb2. Sub-block sb1 is the main sub-block performing all the calculation and processing operations of the circuit, sub-block sb2 being means for setting sub-block sb1 back to a correct state as described hereafter.

The supply or ground lines of each of sub-blocks sb1 and sb2, not shown, are connected to those of the main circuit supply network by switches 130 and 131. Current detectors 134 and 135 are connected to the supply or ground lines of sub-blocks sb1 and sb2. Current detectors 134 and 135 control the turning off or the turning on of switches 130 and 131.

In normal operation, multiplexers M1 to M3 let through the data set at the output of registers R1 to R3. Registers R1 to R3 record the data present on the input at the rate of clock signal CK. Data are transmitted at output S of the device at the rate of the clock signal. Storage circuits F1 to F3 store the data provided by registers R1 to R3 at the rate of clock signal CK. The last k values recorded by each register R1 to R3 are thus stored by storage circuits F1 to F3, k being an integer, for example, equal to 5.

When a latch-up phenomenon triggers in one of sub-blocks sb1 and sb2, an abnormally high current is detected by current detector 134 or 135 and it controls the turning-off of switch 130 or 131. After detection of a significant decrease in the current flowing through the hit sub-block, or after a predetermined time period, switch 130 or 131 is turned back on to supply the hit sub-block again.

A shut-off in the power supply of sub-block sb1 is most likely to induce errors in the values stored by registers R1 to R3. Accordingly, according to an aspect of the present invention, the activity of registers R1 to R3 and of storage circuits F1 to F3 is stopped, for example, by blocking clock signal CK when current detector 134 detects an abnormally high current in sub-block sb1. Then, once switch 130 has been turned back on, sub-block sb1 being supplied again, each of the registers is set back to the state were it was prior to the power shut-off. For this purpose, multiplexers M1 to M3 are set to let through the data provide by storage circuits F1 to F3. Clock signal CK is then reactivated. Once registers R1 to R3 have recovered the values that they had before the power shut-off, the multiplexers are set back to let through the data provided by registers R1 to R3. The device then resumes its normal operation.

When a latch-up phenomenon occurs in sub-block sb2, the shut-off of the power supply of sub-block sb2 has no incidence upon the operation of the elements of main sub-block sb1. Accordingly, after a power shut-off of sub-block sb2, switch 131 is turned back on to supply this sub-block again, without suspending clock signal CK.

Figure 6:
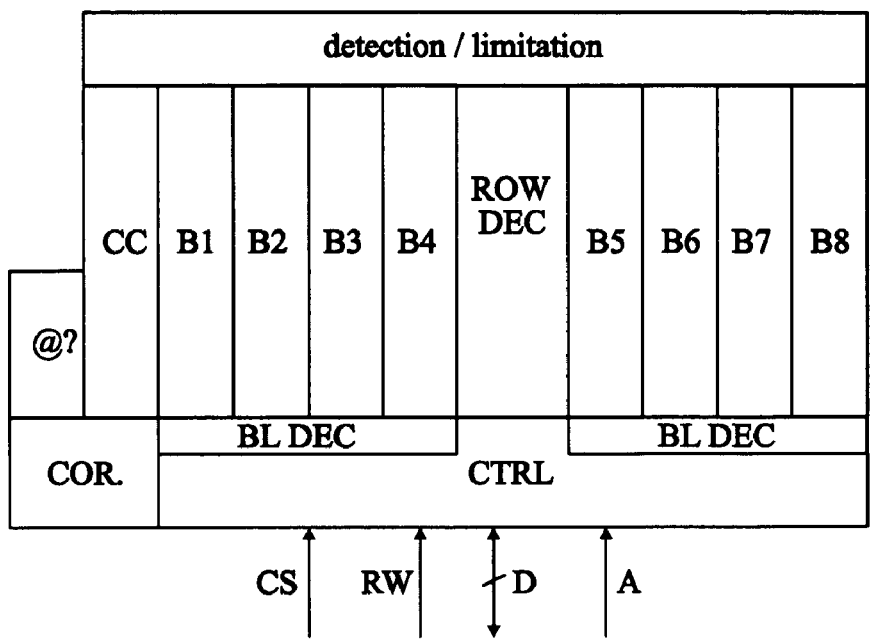
FIG. 6 is a diagram of a memory belonging to an integrated circuit according to the present invention.

FIG. 6 is a diagram of an example of a SRAM-type memory belonging to an integrated circuit according to the present invention. This memory may form an integrated circuit by itself or be one of the functional blocks of an integrated circuit. Generally, the memory described hereafter belongs to a system with which it communicates via a data bus D, a read/write control signal RW, a memory selection signal CS, and an address signal A. This system may be the integrated circuit to which it belongs or be an electronic circuit comprising several elements, among which the integrated circuit in which it is placed.

In this example, the memory stores 8-bit words. It comprises eight memory cell sub-blocks B1 to B8, each sub-block comprising a bit of each word. In other words, the i-th sub-block Bi stores the i-th bit of each word.

Each sub-block is a matrix of cells arranged in columns and in rows. Each bit of a given word is placed on a j-th row of a block B1 to B8 and on a k-th column of a block B1 to B8. Address signal A then breaks up into r row bits and c column bits. A shared row decoder ROW DEC selects a row according to the values of the r row bits. A column decoder BL DEC selects in each sub-block a column according to the values of the c column bits.

A control sub-block CC is placed against sub-block B1. Control sub-block CC comprises a set of words called error-control codes associated with each of the memory words. Each error-control code may be formed of a bit, called parity bit, or of several bits for example forming a Hamming code. In this last case, sub-block CC is divided into several blocks, each comprising one bit of the correction code associated with each memory word. The used error-control codes always are "detection codes" in that they enable detecting an error in a word but are not always "correction" codes since they do not always enable finding the erroneous bit of a word. Further, a correction code is said to be simple or double according to whether it enables correcting one or two bits exhibiting erroneous values.

The memory further comprises a control device CTRL which drives the row and column decoders, and performs read or write operations from or into sub-blocks B1 to B8 and CC. A correction device is associated with control device CTRL to, on reading of a word from the memory, verify the exactness of the 8 bits of the read word against the error-control code CC associated with this word and, in write mode, determine the value of the error-control code associated with the 8 bits of the word to be written.

Sub-blocks B1 to B8 and sub-block CC each have several ground lines and several supply lines connected to one or several memory cell columns. In this example, the ground or supply lines of sub-blocks B1 to B8 and CC are connected to a detection/limitation device provided to detect strong currents in the ground or supply lines connected to groups of memory cells "hit" by a natural radiation and to limit the current in the lines connected to the hit groups. The detection/limitation device is connected to an address storage device @? which references the addresses of the "hit" groups.

Figure 7:
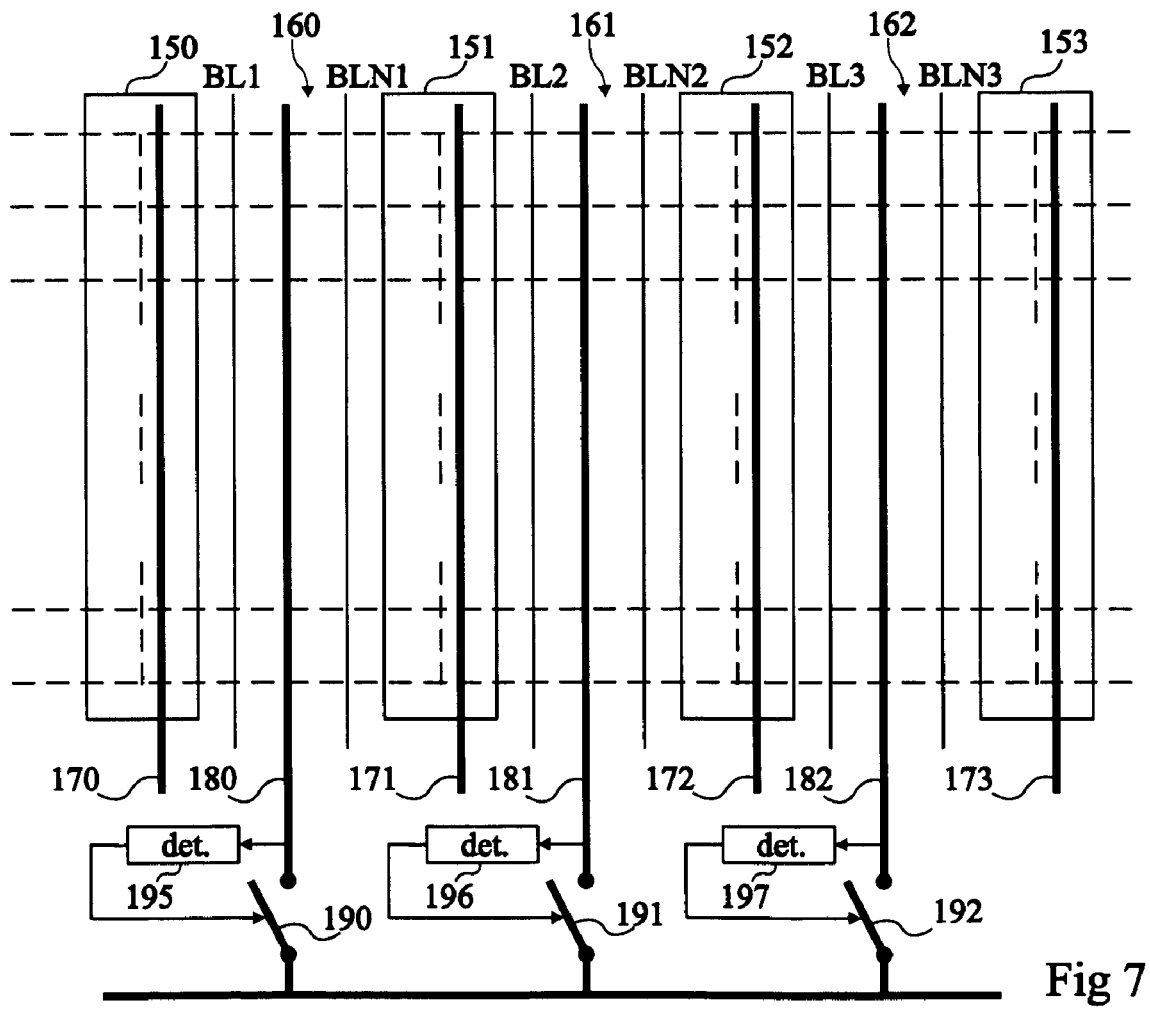
FIG. 7 is a simplified view of a portion of the memory shown in FIG. 5.

FIG. 7 is a simplified view of a portion of one of sub-blocks B1 to B8. Each cell of the SRAM is formed of two P-channel transistors (PMOS) and of four N-channel transistors (NMOS). In the case where the integrated circuit substrate is P-type doped, the NMOS transistors are formed at the surface of the P substrate and the PMOS transistors are formed in N-type doped wells, as in the cell described in relation with FIG. 1. In this example, N-type wells 150, 151, 152, and 153 having the shape of large vertical strips are parallel to one another and separated by larger substrate strips 160, 161, and 162 having a width generally greater than the width of N wells

150 to 153. Each memory cell is formed in an area comprising a portion of a substrate strip and two portions of two wells placed on either side of this substrate strip. The areas taken up by the memory cells are delimited by dotted lines in FIG. 6. The memory cells placed next to one another in a substrate strip 160, 161, or 162 form a column and are connected to a bit line BL and an "inverted" bit line BLN. In this example, three states of bit lines BL1/BLN1, BL2/BLN2, and BL3/BLN3 are shown above substrate strips 160, 161, and 162.

The sources of the PMOS transistors and the well contact areas placed in each N well 150, 151, 152, and 153 are connected to a supply line 170, 171, 172 or 173 placed above the considered well. Similarly, the sources of the NMOS transistors and the substrate contact areas formed at the surface of each substrate strip 160, 161, and 162 are connected to a ground line 180, 181, or 182 placed above the considered substrate strip. In this example, each ground line 180, 181, 182 is connected, via a current-limiting device, to the ground lines of the main supply network of the integrated circuit comprising the SRAM. Supply lines 170, 171, 172, and 173 are directly connected to the main supply network. In this example, the current-limiting devices are switches 190, 191, and 192, shown at the end of ground lines 180, 181, and 182. Current detectors 195, 196, and 197 are connected to ground lines 180, 181, and 182 and connected to switches 190, 191, and 192. The switches and the current detectors placed at the end of ground lines 180 to 182 belong to the SRAM detection/limitation device shown in FIG. 6.

It should be noted that the switches could have been replaced with "resistor" transistors, that is, P- or N-type MOS transistors having their gates connected to ground or to the supply voltage so that they are permanently conductive. Each transistor is then equivalent to a resistor.

However, since current detectors 195, 196 are provided, to identify the rows of memory cells liable to exhibit errors, it is easy to provide current detectors capable of controlling the transistors placed at the end of each ground line to have them operate as switches. However, a systematic shut-off of the power supply of a cell column, by turning off the switch connected to the ground line connected to this column, almost systematically causes errors in the cells of this column, by switching the values stored by the cells from "0" to "1" or from "1" to "0". Conversely, when "resistor" transistors are used, the memory cells are permanently powered. And even if a disturbance of the voltage and current levels in the ground line connected to a column comprising cells hit by a radiation can be observed, there is a lower probability for errors to be introduced into memory cells of the considered column. As a conclusion, it may be advantageous to combine the use of "resistor" transistors and of switches by controlling a turning off of the transistors only in the case where a short-circuit persists without having been able to be "naturally" stopped by the resistor transistors.

When an ionizing radiation reaches a substrate strip 160, 161, or 162, the parasitic components of one or of several memory cells, such as shown in FIG. 1, may be activated and give rise to a latch-up phenomenon at the level of the considered substrate strip and of the neighboring wells, for example, substrate strip 160 and wells 150 and 151. Ground line 180 placed above substrate strip 160 is then run through by an increasingly high current which will be limited due to the current-limiting device placed at the end of this ground line. During this "incident", errors may have introduced into the values stored by the cells comprising transistors connected to ground line 180. In this example, the cells connected to the pair of bit lines BL1/BLN1 are likely to exhibit errors. On indication of the memory detection/limitation circuit, address storage device @? references the hit memory cell column. In practice, address storage device @? stores the values of the c column bits corresponding to the column associated with the pair of bit lines BL1/BLN1 as well as the number of sub-block B1 to B8 in which the latch-up phenomenon has occurred.

According to the position of the impact of an ionizing radiation, it is possible for several ground lines to be crossed by an abnormally high current and for errors to be introduced into memory cells belonging to two successive columns. In the case, for example, where a radiation would reach well 151, it is possible for errors to be introduced into the memory cell columns connected to the pairs of bit lines BL1/BLN1 and BL2/BLN2. In such a case, the current-limiting devices connected to these columns are activated and address storage device @? references the "hit" columns, that is, the values of the c column bits corresponding to these columns, and the number of the sub-block to which the columns belong.

In normal operation, the memory performs operations controlled by the rest of the electronic system to which it belongs. When a reading of a memory word is requested, the correction device verifies that the read word is correct based on the error control code CC associated with the read word. In the opposite case, when the read word is incorrect, the correction device determines the correct word which should have been stored based on the error-control code and on the data provided by address storage device @?.

In the memory example shown in FIG. 6, since the bits of each word are placed on 8 columns separated from one another by a large number of columns, it is almost improbable for two bits of a same word to belong to two hit columns. Accordingly, it can be considered that in the case where the read word is incorrect, only one of its bits erroneous. The erroneous bit can then be identified based on the data stored by address storage device @?. Further, given that for a given word, a single bit can be erroneous, very simple error-control codes CC, that is, of low "bulk", may be used. The simplest error-control code is a parity bit.

In the case where there is a non-negligible probability for a memory to receive several ionizing radiations during its operating time, it is possible for several bits of a same word to be erroneous. It is then necessary to use error-control codes which, when combined with the data stored by address storage device @?, enable correcting words exhibiting two or more errors. Simple error-correction codes such as Hamming codes and if necessary double correction codes can then be used. However, instead of using "bulky" correction codes to be able to correct such errors, a "dynamic" correction device which corrects the errors of the hit memory block(s) without waiting for the words containing errors to be read and corrected on normal execution of the operations controlled by the electronic system to which the memory belongs may be provided. This dynamic correction device verifies and, if necessary, corrects the hit column cells which are referenced by address storage device @?, by performing a series of read and possibly of write operations. These read and write operations are preferably performed with no interruption of the control sequence executed by the electronic system comprising the "hit" memory.

FIG. 7 is a flowchart illustrating in further detail the operations to be performed by such a dynamic correction device to set back correct values in the memory after the activation of a current detector of the memory such as shown in FIG. 6. The dynamic correction device regularly verifies whether address storage device @? references one or several memory columns. If such is the case, the dynamic correction device will "scan" all the memory words having their column address referenced by address storage device @?. By selecting a column address, corresponding to a given value of the c column bits stored in address storage device @?, the scanning comprises successively selecting each memory row by incrementing the value of the r row bits.

For this purpose, the dynamic correction device verifies whether the memory is being used, that is, whether memory selection signal CS is "active" and set, for example, to "1". The dynamic correction device remains inactive as long as the memory is being used. When the memory is available, that is, memory selection signal CS becomes zero, the correction device reads word M0 placed on the first selected row with R=0. The correction device then determines whether read word M0 is correct against the error control code CC associated with this word. If word M0 is incorrect, the correction device determines the correct word M0' which should normally be stored, based on the error-control code associated with read word M0 and on the data stored by address storage device @?. The correction device then verifies whether the memory is used and waits until the memory is available to write word M0' into the memory to replace word M0. In the case where read word M0 is correct, the correction device increments the value of the r row bits to be able to select the second row, r=1. The dynamic correction device verifies again whether the memory is available and waits, if necessary, until it can read word M1 from address r=1. The correction device performs again all the operations previously described for first row r=0 and continues in the same way until the last row has been reached. It then performs the same operations for all the column addresses referenced by address storage device @?.

The previously-described correction method is provided to avoid disturbing the normal operation of the electronic system to which the memory belongs. However, in the case where the memory is almost always requested by the electronic system, to perform a reading, a writing, or other, it may be necessary to interrupt or to slow down the operation of the electronic system to perform error corrections in the memory to avoid for too large a number of errors to accumulate in the memory cells so that it is no longer possible to correct them.

The error-correction method previously described in relation with FIG. 7 corresponds to that implemented by a dynamic address-correction device associated with a memory such as that described in relation with FIG. 6. However, this method may be adapted to any type of memory comprising an error-detection device capable of indicating the memory cells likely to exhibit errors.

Further, according to the used memory type, it may be possible to provide error-correction operations while the memory is active and a read, write, or other operation is being performed in the memory. Content-addressable memories CAM may especially be mentioned. Such memories comprise a set of words. Each word comprises an address and one or several other fields, data fields for example. The cutting-up of the memory cells, or in other words of the bit assembly, may be performed so that a first elementary block comprises all the first bits of each word, a second elementary block comprises all the second bits of each word, and so on. Prior to a reading or a writing of a word, an address search operation comprising comparing a given address value with the address values contained in the address fields of the set of words of the CAM memory is generally performed. During such search operations, the dynamic correction circuit may perform read and if necessary write operations to correct errors having introduced into the address fields of the memory after a short-circuit in this memory.

Further, whatever the type of architecture of the considered memory, the cutting-up, or in other words the distribution, of the memory cells into several elementary blocks must be performed by taking into account the correction means that can be used. A cutting-up enabling using simple correction means will preferably be retained. The correction means are all the simpler as, for a given memory word, the number of bits of this word likely to exhibit errors after a shut-off or a disturbance of the power supply of some elementary blocks is low. It could in particular be ascertained for the bits of each word to belong to distinct elementary blocks and if possible as remote as possible from one another.

Further, for a given type of correction means, the memory cell cutting-up may be provided to finer or coarser. In the memory example previously described in relation with FIG. 7, the cutting-up may be coarser or finer. The assembly of the ground lines of a same sub-block B1 to B8 could be connected to the ground lines of the main supply network via a single current-limiting device. Conversely, in each block, two ground lines may be provided for each memory cell column, a line connected to the sources of the NMOS transistors and another line connected to the substrate contact areas of the substrate strip housing the cells of the considered column. Each ground line or one ground line out of two would then be connected to the main supply network via a current-limiting device. In the second case, preferably the ground lines connected to the sources do the NMOS transistors are connected to the main supply network via a current-limiting device, the ground lines connected to the substrate contact areas being then directly connected to the main supply network.

Further, in the case where the used memory is formed of several memory cell blocks connected to distinct read/write circuits, a dynamic correction circuit may perform corrections in the "inactive" blocks while a reading or a writing is performed in the active block.

Figure 9:
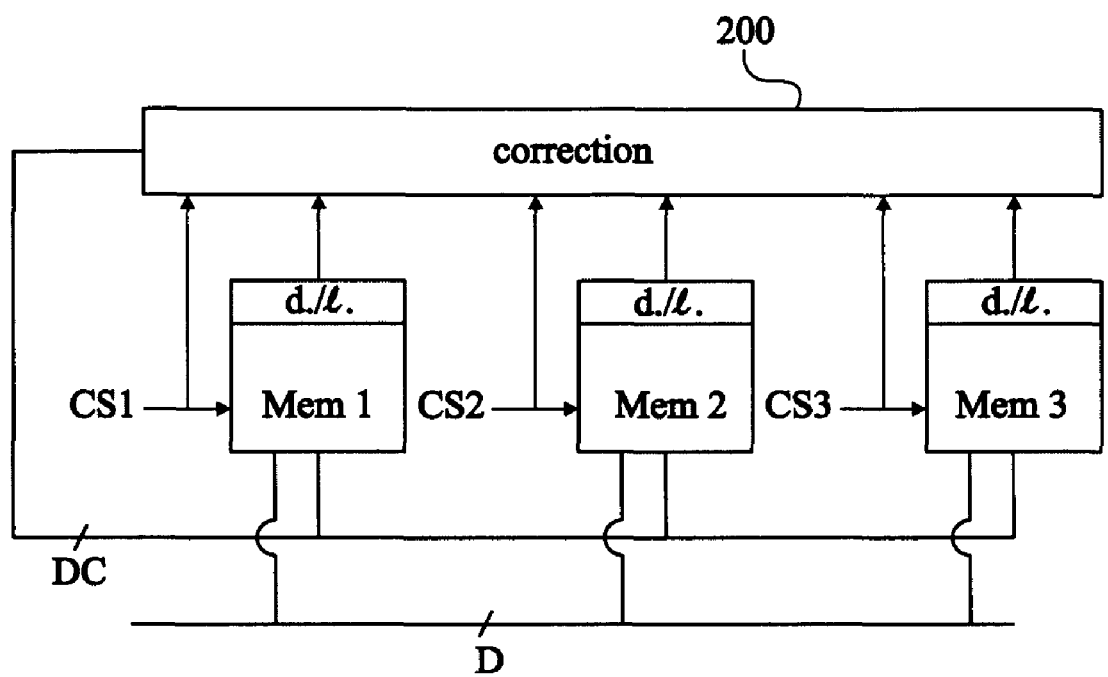
FIG. 9 is a diagram of an integrated circuit according to the present invention comprising several memories connected to a common error-correction device.

FIG. 9 is a diagram of an electronic system comprising several memories Mem1, Mem2, and Mem3. The memories may belong to distinct integrated circuits or belong to a same integrated circuit. The memories may be of SRAM type as those shown in FIG. 6 or of any other type. Each of memories Mem1, Mem2, and Mem3 comprises, like the memory shown in FIG. 6, a detection/limitation device connected to the memory cells to detect abnormally high currents in a "hit" portion of the memory and limit the current flowing through this hit memory portion on occurrence of a short-circuit. The detection/limitation devices of memories Mem1, Mem2, and Mem3 are connected to a common error-correction device 200. Memories Mem1, Mem2, and Mem3 communicate with the rest of the system via, among others, a data bus D. Each of memories Mem1, Mem2, and Mem3 may be activated by a selection signal CS1, CS2, or CS3 which is also transmitted to common error-correction device 200. Device 200 communicates with memories Mem1, Mem2, and Mem3 via, among others, a correction data bus Dc.

Figure 8:
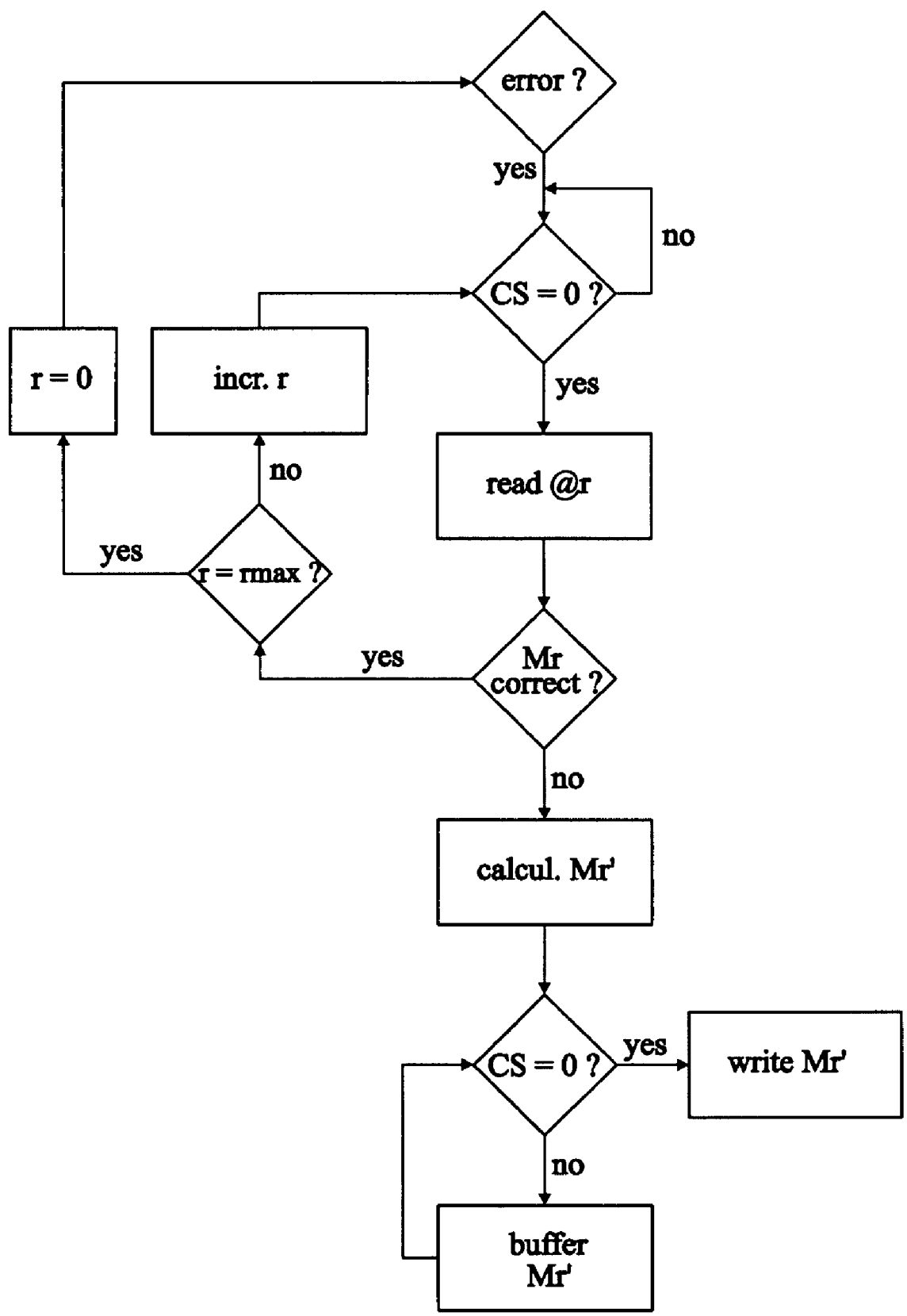
FIG. 8 is a diagram illustrating the operation of an error-correction device in a memory belonging to an integrated circuit according to the present invention.

When a short-circuit starts in one of memories Mem1, Mem2, or Mem3, the detection/limitation device associated with the hit memory informs common correction device 200 that a portion of the memory has been hit and that the cells of this portion could exhibit errors. The common correction device then performs the operations previously described in relation with FIG. 8 to correct the possible errors in the hit memory. Common error-correction device 200 preferably performs the readings from and possibly the writings into the hit memory when said memory is available, avoiding to interrupt the execution of the integrated circuit control sequence.

According to an alternative embodiment of a memory of an integrated circuit according to the present invention, at least one current detector connected to an elementary block of the circuit is provided to detect two types of abnormally high currents. The first type of abnormally high current is that corresponding to the occurrence of a latch-up phenomenon such as described previously. The second type of abnormally high current is observed when a current peak appears at the level of a block when said block is inactive. Such a current peak may be due to a modification in the value of one or of several memory cells after the passing of an ionizing radiation at the level thereof. For more details, reference can be made to European patent EP-A-0765497.

Such current detectors are provided with two threshold currents Is1 and Is2. Threshold current Is1 is greater than the current normally used by the elementary block when said block is active. Threshold current Is2 is slightly greater than the "leakage" current flowing through the considered block when said block is inactive. In the case where the considered block is a memory cell column, threshold current Is1 is provided to be greater than the currents of reading from and writing into a cell in the column, and threshold current Is2 is provided to be slightly greater than the leakage current through the column cells when no column cell is read or written, threshold current Is1 being accordingly greater than threshold current Is2.

When the current flowing through the ground or supply lines of the considered block exceeds threshold current Is1, the various previously-described operations are performed.

When a current peak, greater than Is2 and lower than Is1, is detected by the current detector, said detector informs a control circuit so that it determines whether this current peak is normal. If the elementary block at the level of which a current peak has been detected is not active, the control circuit deduces therefrom that an error has introduced into the considered block. In the case of a memory, if a current peak is detected while no writing or reading is performed, the control circuit deduces therefrom that one or several errors have introduced into the memory cells belonging to the considered block. The control circuit then stores these data in an address storage device such as that of the memory shown in FIG. 6. An error search, and possibly an error correction, may then be performed by an error-correction device proceeding for example as described previously in relation with FIG. 8.

It may possibly be provided to connect, to the ground or supply lines of elementary blocks of a memory, current detectors which comprise a single threshold of type Is2 to only detect transient current peaks likely to correspond to local modifications of values stored by memory cells.

Of course, the present invention is likely to have various alterations, modifications, and improvements which will readily occur to those skilled in the art. In particular, those skilled in the art may devise other error-correction means adapted to the various types of elementary blocks of an integrated circuit according to the present invention.

It should further be specified that an integrated circuit according to the present invention corresponds to an integrated circuit "chip". Such a chip is a monolithic block comprising the integrated circuit components formed, for example, in and on a semiconductor substrate.

Further, although in the previously-described examples, the transistors used as current-limiting devices are of MOS type, other transistor types may be used, for example, bipolar transistors. Generally, other current-limiting devices could be devised by those skilled in the art.

Moreover, although the examples of memories previously described in relation with FIGS. 6 to 9 comprise current detectors connected to the various elementary blocks of the memory, memories only comprising current-limiting devices and no current detector may be provided. Such current-limiting devices may for example be resistor transistors. No address storage device @? is then used. A dynamic correction device can then perform random memory verifications to verify whether errors have introduced.

Further, the previously-described error-correction means or devices may be placed among the peripheral circuits of a memory, in the integrated circuit comprising the memory or outside of the integrated circuit comprising the memory. In this last case, they may be placed in another integrated circuit connected to the integrated circuit comprising the memory, the two integrated circuits being for example placed on a same electronic card.

Moreover, the current detectors connected to the elementary blocks of an integrated circuit according to the present invention may be used for other uses than those described previously. They may for example be used in integrated circuit test phases to detect abnormally high currents. Such currents are for example due to memory cells or to defective logic gates.

Further, switch-type current-limiting devices may be used to cut off the power supply of an inactive block to limit its current consumption.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit chip comprising a number of semiconductor components exhibiting parasitic components through which a short-circuit between the circuit supply voltage and ground could occur, wherein said semiconductor components are distributed in elementary blocks,
   each elementary block being independently connected, for its power supply, to the supply or ground lines of the main supply network of the integrated circuit by a current-limiting device capable of stopping a short-circuit starting in the considered block, and
   each elementary block being sized so that logic errors occurring each elementary block are correctable by error-correction means.

2. The integrated circuit chip of claim 1, further comprising for at least one elementary block, a current detector capable of detecting an abnormally high current in the considered block.

3. The integrated circuit chip of claim 2, wherein at least one current-limiting device associated with an elementary block is a switch placed between the ground or supply lines of this elementary block and those of the integrated circuit supply network, this switch being controlled by the current detector connected to the considered elementary block to turn off the switch when the current flowing through the ground or supply lines of the considered block is greater than a predefined threshold value.

4. The integrated circuit chip of claim 1, wherein the current-limiting devices are transistors.

5. The integrated circuit chip of claim 2, wherein each time a given current detector detects an abnormally high current, said error-correction means correct the possible errors introduced into the elementary block connected to the given current detector.

6. The integrated circuit chip of claim 1, further comprising at least one memory storing a set of words of several bits, each bit corresponding to a memory cell, the memory cells being distributed in different elementary blocks and the ground or supply line(s) of each elementary block of cells being connected to the ground or supply lines of the main supply network of the integrated circuit via a current-limiting device.

7. The integrated circuit chip of claim 6, wherein the distribution of the memory cells in different elementary blocks is such that each elementary block comprises at most a single bit of a given word.

8. The integrated circuit chip of claim 6, wherein each memory comprises a control block in which are stored error-correction codes, each error-correction code being associated with a word in the memory, and said error-correction means use the values stored by the error-correction codes to correct the possible errors present in a memory.

9. The integrated circuit chip of claim 6, wherein each memory comprises a control block in which are stored error-detection codes, each error-correction code being associated with a word in the memory, and wherein said error-correction means use the values stored by the error-detection codes to correct the possible errors present in a memory.

10. The integrated circuit chip of claim 2, further comprising at least one address storage device referencing the elementary blocks of a memory in which an abnormally high current has been detected by current detectors associated with these blocks, the error-correction means using the data referenced by said at least one address storage device to correct errors present in a memory.

11. The integrated circuit chip of claim 10, wherein the error-correction means regularly verify whether said at least one address storage device references an elementary block, and if such is the case, the error-correction means perform readings of the words of the memory comprising cells placed in the referenced elementary block, then verify whether the read words are correct by means of error-control codes associated with each of these words, and perform, if necessary, writings into the considered memory to correct the words exhibiting errors.

12. The integrated circuit chip of claim 2, wherein current detectors associated with the elementary cell blocks are provided to detect two types of abnormally high currents in the ground or supply lines of these elementary blocks, the first type of abnormally high current being a current of high intensity corresponding to a short-circuit between the supply voltage and the circuit ground, the second type of abnormally high current being a transient current peak reflecting a change in the value stored in one or more of the memory cells, a detection of a first or of a second type of current being indicated to the error-correction means so that the latter perform, if necessary, error corrections in the concerned memory.

13. The integrated circuit chip of claim 2, further comprising a synchronous logic processing device, such as a microprocessor, which comprises a set of registers in series between an input and an output of the device, the output of each register being connected to an input of a multiplexer and to an input of a storage element having its output connected to the other input of the multiplexer, the output of each multiplexer being connected to the input of a register or to the output of the device via, possibly, a combinational block, the registers, the multiplexers, and the combinational blocks forming a first elementary block and the storage elements forming a second elementary block, the registers recording the data present on their inputs at the rate of a clock signal, each storage element keeping the last k values recorded by the register to which it is connected, the storage elements forming error-correction means capable of setting back the registers to a correct logic state after a detection of an abnormally high current in the first elementary block.

14. An electronic system comprising the integrated circuit chip of claim 1, said error-correction means being placed outside of the chip and being connected to the chip by a set of electric connections.

15. The integrated circuit chip of claim 9, wherein the error detection codes include parity bits.

* * * * *